US012689176B2

(12) United States Patent
Akikusa et al.

(10) Patent No.: US 12,689,176 B2
(45) Date of Patent: Jul. 21, 2026

(54) QUANTUM-CASCADE LASER MODULE

(71) Applicant: HAMAMATSU PHOTONICS K.K., Hamamatsu (JP)

(72) Inventors: Naota Akikusa, Hamamatsu (JP); Tatsuo Dougakiuchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 680 days.

(21) Appl. No.: 18/025,723

(22) PCT Filed: Aug. 19, 2021

(86) PCT No.: PCT/JP2021/030436
§ 371 (c)(1),
(2) Date: Mar. 10, 2023

(87) PCT Pub. No.: WO2022/059416
PCT Pub. Date: Mar. 24, 2022

(65) Prior Publication Data
US 2023/0369823 A1  Nov. 16, 2023

(30) Foreign Application Priority Data
Sep. 15, 2020  (JP) ................................. 2020-154510

(51) Int. Cl.
*H01S 5/022* (2021.01)
*F21K 9/00* (2016.01)
(Continued)

(52) U.S. Cl.
CPC ...... *H01S 5/02325* (2021.01); *H01S 5/02253* (2021.01); *H01S 5/02257* (2021.01); *H01S 5/02407* (2013.01); *H01S 5/3402* (2013.01)

(58) Field of Classification Search
CPC ............. H01S 5/02253; H01S 5/02257; H01S 5/02407; H01S 5/022; F21V 19/0035;
(Continued)

(56) References Cited

U.S. PATENT DOCUMENTS

2018/0287347 A1* 10/2018 Hashimoto ............. H01S 5/023
2020/0119520 A1   4/2020 Bayer et al.

FOREIGN PATENT DOCUMENTS

CN      210864159 U     6/2020
CN      114640018 A  *  6/2022  ........... H01S 5/3401
(Continued)

OTHER PUBLICATIONS

International Preliminary Report on Patentability mailed Mar. 30, 2023 for PCT/JP2021/030436.

*Primary Examiner* — Tod T Van Roy
*Assistant Examiner* — Delma R Forde
(74) *Attorney, Agent, or Firm* — Faegre Drinker Biddle & Reath LLP

(57) ABSTRACT

A QCL module according to an embodiment includes a package accommodating a QCL element and provided with a window material for extracting a laser beam emitted from the QCL element to the outside, a lens hold member for holding a lens on which the laser beam output from the window material is incident, a cooling fan for cooling the package, and a base for holding the package, the lens hold member, and the cooling fan. The package and the lens hold member are fastened together to the base by a common screw member.

6 Claims, 5 Drawing Sheets

(51) Int. Cl.
 *H01S 5/02253*   (2021.01)
 *H01S 5/02257*   (2021.01)
 *H01S 5/02325*   (2021.01)
 *H01S 5/024*     (2006.01)
 *H01S 5/34*      (2006.01)

(58) Field of Classification Search
 CPC .... F21V 19/002; F21V 19/0055; F21V 29/67;
 F21V 29/00; F21V 29/80; F21K 9/00
 See application file for complete search history.

(56) References Cited

FOREIGN PATENT DOCUMENTS

| | | | | |
|---|---|---|---|---|
| JP | S58-040882 | A | 3/1983 | |
| JP | S5840882 | * | 3/1983 | .............. H01S 5/00 |
| JP | H3-119811 | U | 12/1991 | |
| JP | 2004-104094 | A | 4/2004 | |
| JP | 2006-332447 | A | 12/2006 | |
| JP | 2011-096790 | A | 5/2011 | |
| JP | 2012-074146 | A | 4/2012 | |
| JP | 2014-138046 | A | 7/2014 | |
| JP | 2017-188256 | A | 10/2017 | |
| JP | 2018-170454 | A | 11/2018 | |
| JP | 2019-053941 | A | 4/2019 | |
| JP | 2019-096637 | A | 6/2019 | |
| KR | 101841221 | B1 * | 3/2018 | ............ G02B 7/282 |
| WO | WO 2017010527 | * | 1/2017 | ........... F21S 41/143 |

* cited by examiner

QUANTUM-CASCADE LASER MODULE

TECHNICAL FIELD

The present disclosure relates to a quantum cascade laser module.

BACKGROUND ART

Conventionally, a module in which a light source element, a lens holder, and a cooling fan for cooling the light source element are integrated is known (for example, refer to Patent Documents 1 and 2). Patent Document 1 discloses a configuration including an LED unit (LED substrate and LED package), an illumination unit (lens group), and a cooling fan. In the configuration described in Patent Document 1, the installation member on which the illumination unit is mounted and the LED substrate are separately fixed to the base. Patent Document 2 discloses a configuration in which a light source module, a lens holder, and a cooling fan are fixed to a light source holder. In the configuration described in Patent Document 2, the light source module and the lens holder are separately fixed to the light source holder.

CITATION LIST

Patent Document

Patent Document 1: Japanese Unexamined Patent Application Publication No. 2017-188256
Patent Document 2: Japanese Unexamined Patent Application Publication No. 2019-096637

SUMMARY OF INVENTION

Technical Problem

A quantum cascade laser (hereinafter referred to as "QCL") may be used as a light source of the above-described module. The module including the QCL is used, for example, for measuring the concentration of gas. For example, a gas cell in which a gas to be measured is sealed is disposed between the module and a photodetector, a laser beam emitted from the module passes through the gas cell, and the laser beam after passing through the gas cell is detected by the photodetector, whereby the concentration of the gas in the gas cell (absorbance of the laser beam) can be measured. Since the QCL has excellent monochromaticity (that is, excellent wavelength resolution), it can be suitably used for measuring the concentration of the gas as described above. On the other hand, optical noise occurs in principle due to the above-described excellent monochromaticity. More specifically, fringe noise (interference noise) is generated by an interference component between the radiation end surface of the QCL and the interface of the lens included in the module.

If the optical condition (for example, the Fabry-Perot cavity length) between the QCL and the lens does not temporally change, the optical noise can be treated as an invariant, and thus the optical noise can be removed by the background calculation. However, when the module includes the cooling fan as described above, a deviation may occur between the vibration of the QCL and the vibration of the lens due to the vibration of the cooling fan. In particular, when the light source and the lens are separately fixed to a base member (i.e., the base in Patent Document 1 and the light source holder in Patent Document 2) as in the configurations described in Patent Documents 1 and 2, the vibration of the QCL and the vibration of the lens do not have the same phase, and the positional relationship between the QCL and the lens (i.e., the optical path length) is likely to change over time. In this case, since the optical condition varies with time, the optical noise cannot be treated as an invariant. That is, the optical noise cannot be removed by the background calculation. Therefore, the sensitivity (detection limit) in the above-described measurement is limited.

Therefore, in order to suppress the occurrence of vibration that causes temporal fluctuation of the optical conditions, it is conceivable to use a water-cooling jacket or the like that does not cause vibration instead of using the cooling fan. However, in this case, since a device for circulating the cooling water is required, the entire module becomes large and complicated, and maintenance and inspection costs also increase.

Accordingly, it is an object of the present disclosure to provide a quantum cascade laser module capable of reducing optical noise caused by temporal variation of an optical condition in a configuration including a cooling fan.

Solution to Problem

According to an aspect of the present disclosure, there is provided a quantum cascade laser module including: a package that accommodates a quantum cascade laser element and is provided with a window material through which a laser beam emitted from the quantum cascade laser element is extracted to the outside; a lens hold member configured to hold a lens on which the laser beam output from the window material is incident; a cooling fan configured to cool the package; and a base that holds the package, the lens hold member, and the cooling fan. The package and the lens hold member are fastened together to the base by a common shaft member.

The quantum cascade laser module includes a cooling fan to cool the package. According to such a configuration, it is possible to achieve miniaturization and simplification of the module compared to a case where a cooling mechanism of another type (for example, a water cooling type) is provided. In the quantum cascade laser module, the package as a light source and the lens hold member are fastened together to the base by a common shaft member. That is, the package and the lens hold member are integrally fixed by the common shaft member. Thus, the vibration pattern caused by the vibration of the cooling fan is common between the package and the lens held by the lens hold member. As a result, the variation of the relative positional relationship between the package and the lens is suppressed, and the temporal variation of the optical condition (for example, the Fabry-Perot cavity length) between the package and the lens is suppressed. As a result, it is possible to reduce optical noise caused by temporal fluctuation of the optical condition.

The package may be disposed between the base and the lens hold member such that the window material faces the lens, and the package and the lens hold member may be fastened together to the base by fastening the lens hold member to the base. Accordingly, the lens hold member and the package can be integrally fixed to the base so that the package is sandwiched between the lens hold member and the base.

The quantum cascade laser module may further include a spacer disposed between the lens hold member and the base. The package may have a flange that abuts against the base and extends along the base, and the spacer may be disposed between a surface of the lens hold member facing the base and a surface of the flange facing the lens hold member, so that a gap is formed between the lens hold member and the window material. Accordingly, it is possible to prevent distortion (deformation) from occurring in the window material due to contact between the lens hold member and the window material. As a result, deterioration of the laser beam caused by the distortion can be suppressed.

The flange may include a first flange and a second flange formed on both sides of the window material. The spacer may include: a first spacer disposed between the surface of the lens hold member facing the base and a surface of the first flange facing the lens hold member; and a second spacer disposed between the surface of the lens hold member facing the base and a surface of the second flange facing the lens hold member. In this way, by arranging the pair of spacers (the first spacer and the second spacer) between the package and the lens hold member in a well-balanced manner, the physical stabilities of the package and the lens hold member can be enhanced, and the variation in the relative positional relationship between the package and the lens hold member can be effectively suppressed.

A through hole through which the shaft member is inserted may be formed in each of the lens hold member, the spacer, the flange, and the base, and the lens hold member may be fastened to the base by the shaft member inserted through the through hole of each of the lens hold member, the spacer, the flange, and the base, so that the lens hold member, the spacer, and the flange are fastened together to the base. In this case, the shaft member is passed through the lens hold member, the spacer, and the flange and is inserted into the through hole of the base, whereby the lens hold member, the spacer, and the flange can be integrally and firmly fixed to the base. Accordingly, it is possible to effectively suppress the variation in the relative positional relationship between the package and the lens hold member.

A through hole through which the shaft member is inserted may be formed in each of the lens hold member and the base, and in a state where the spacer and the flange are disposed between the lens hold member and the base, the lens hold member may be fastened to the base by the shaft member inserted into the through hole of each of the lens hold member and the base, so that the lens hold member, the spacer, and the flange are fastened together to the base. In this case, the shaft member is passed through the lens hold member and inserted into the through hole of the base, and the lens hold member and the base sandwich the spacer and the flange disposed therebetween, whereby the lens hold member, the spacer, and the flange can be integrally and firmly fixed to the base. Accordingly, it is possible to effectively suppress the variation in the relative positional relationship between the package and the lens hold member.

The spacer may be formed of a material having heat conductivity lower than that of the base. Thus, heat generated in the package can be efficiently released not to the spacer but to the base.

Advantageous Effects of Invention

According to an aspect of the present disclosure, it is possible to provide a quantum cascade laser module capable of reducing optical noise caused by temporal variation of an optical condition in a configuration including a cooling fan.

DESCRIPTION OF EMBODIMENTS

Figure 1:
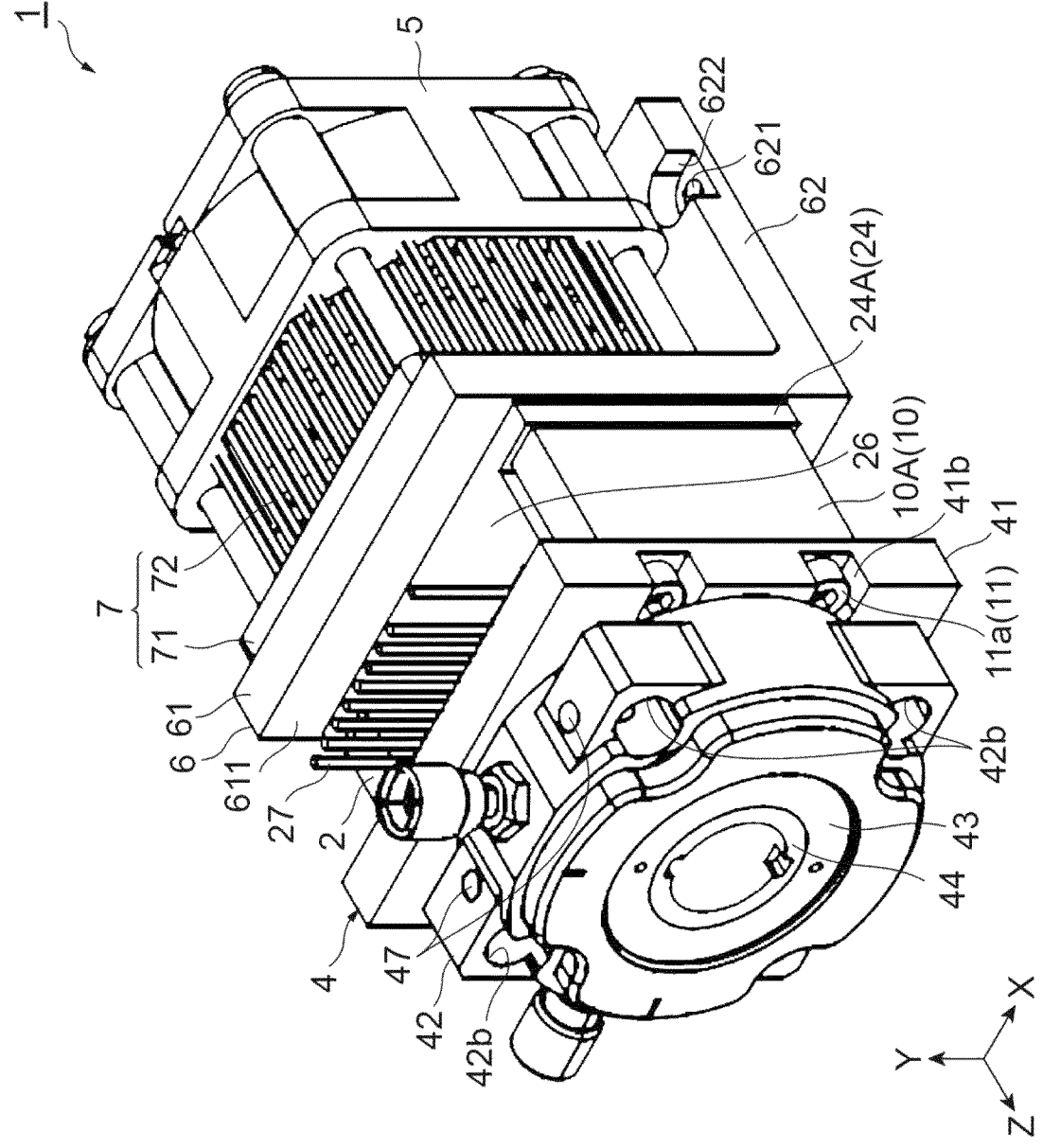
FIG. 1 is a perspective view of a quantum cascade laser module according to an exemplary embodiment.
Figure 2:
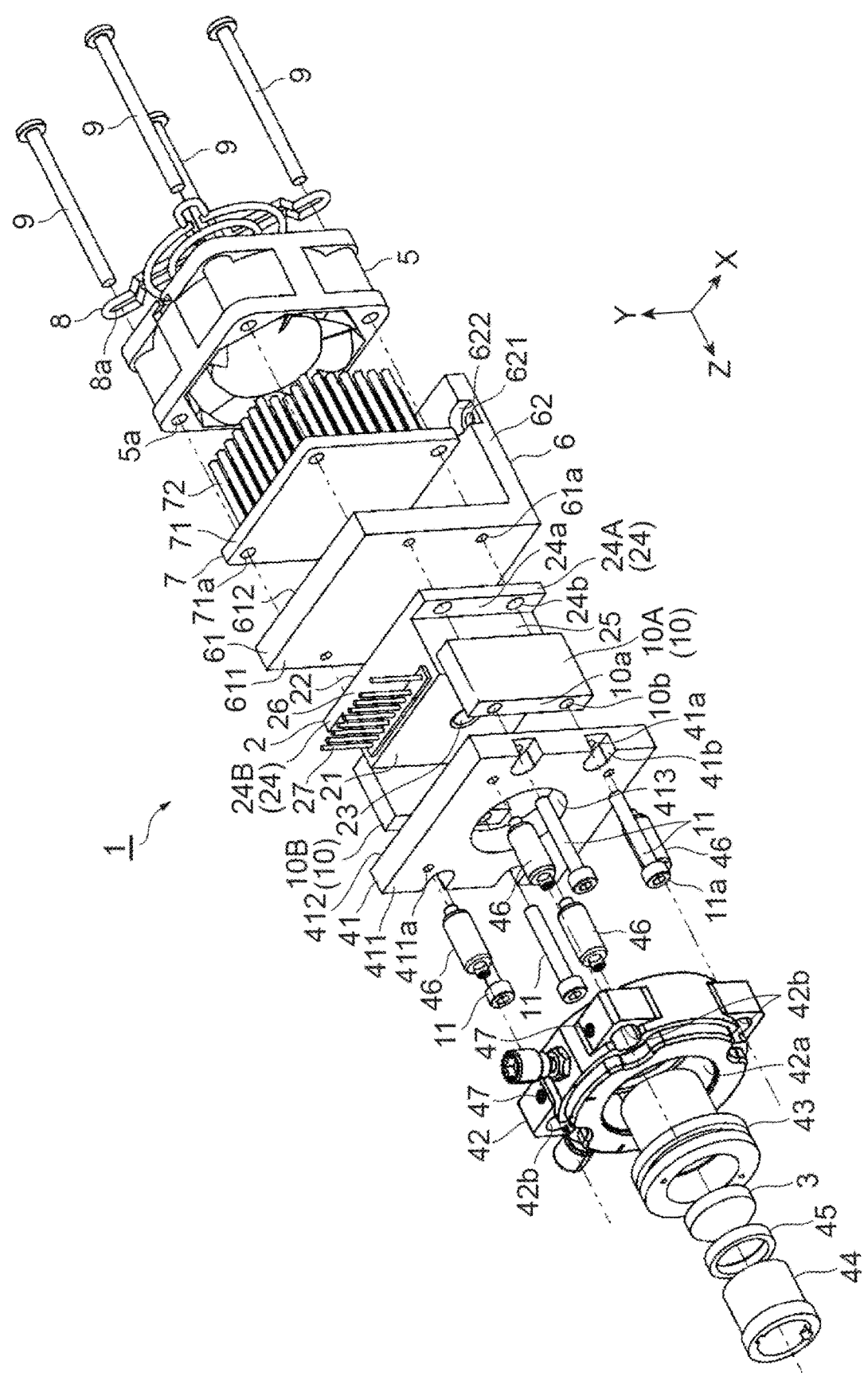
FIG. 2 is an exploded perspective view of the quantum cascade laser module of FIG. 1.
Figure 3:
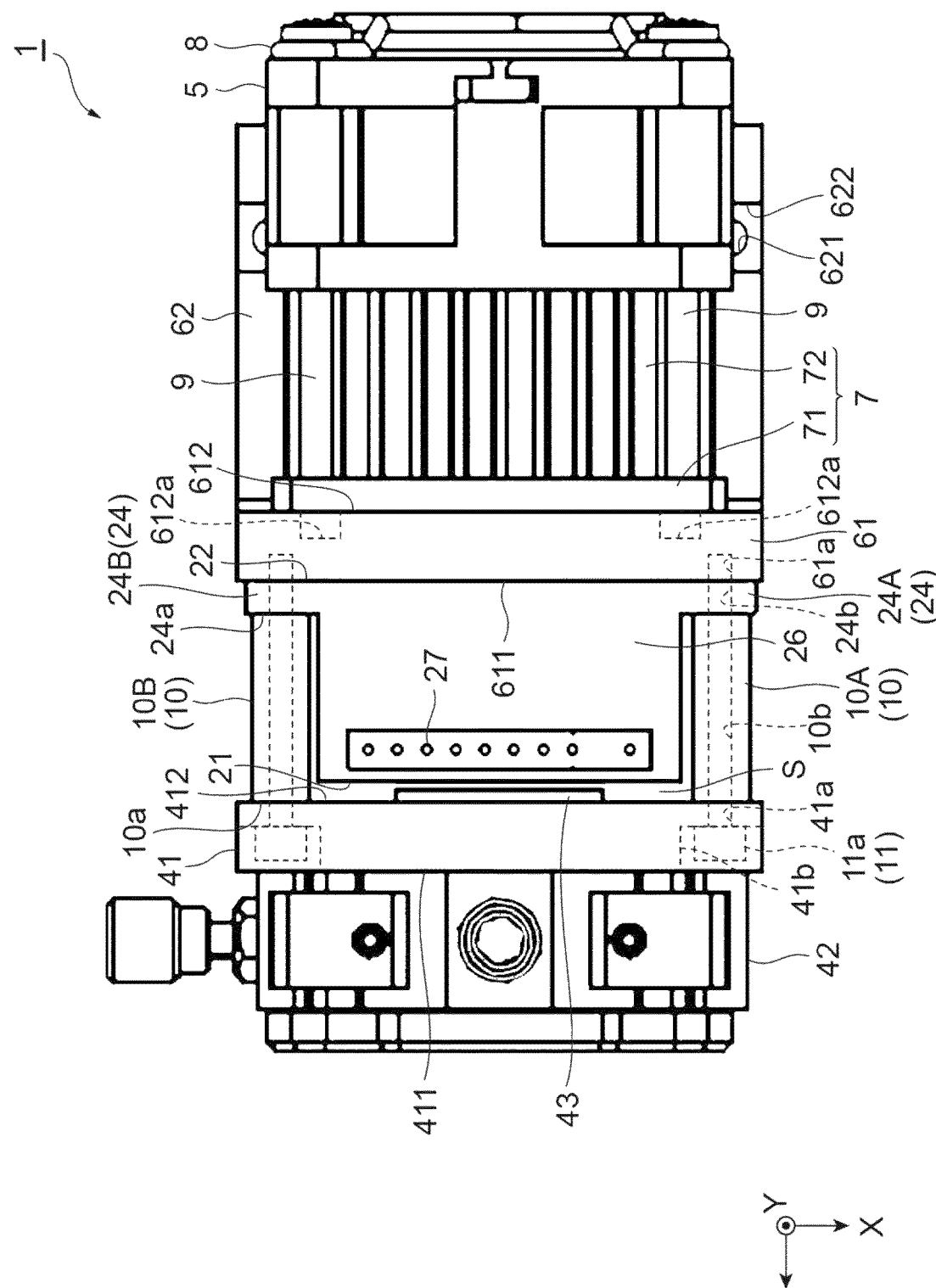
FIG. 3 is a top view of the quantum cascade laser module of FIG. 1.
Figure 4:
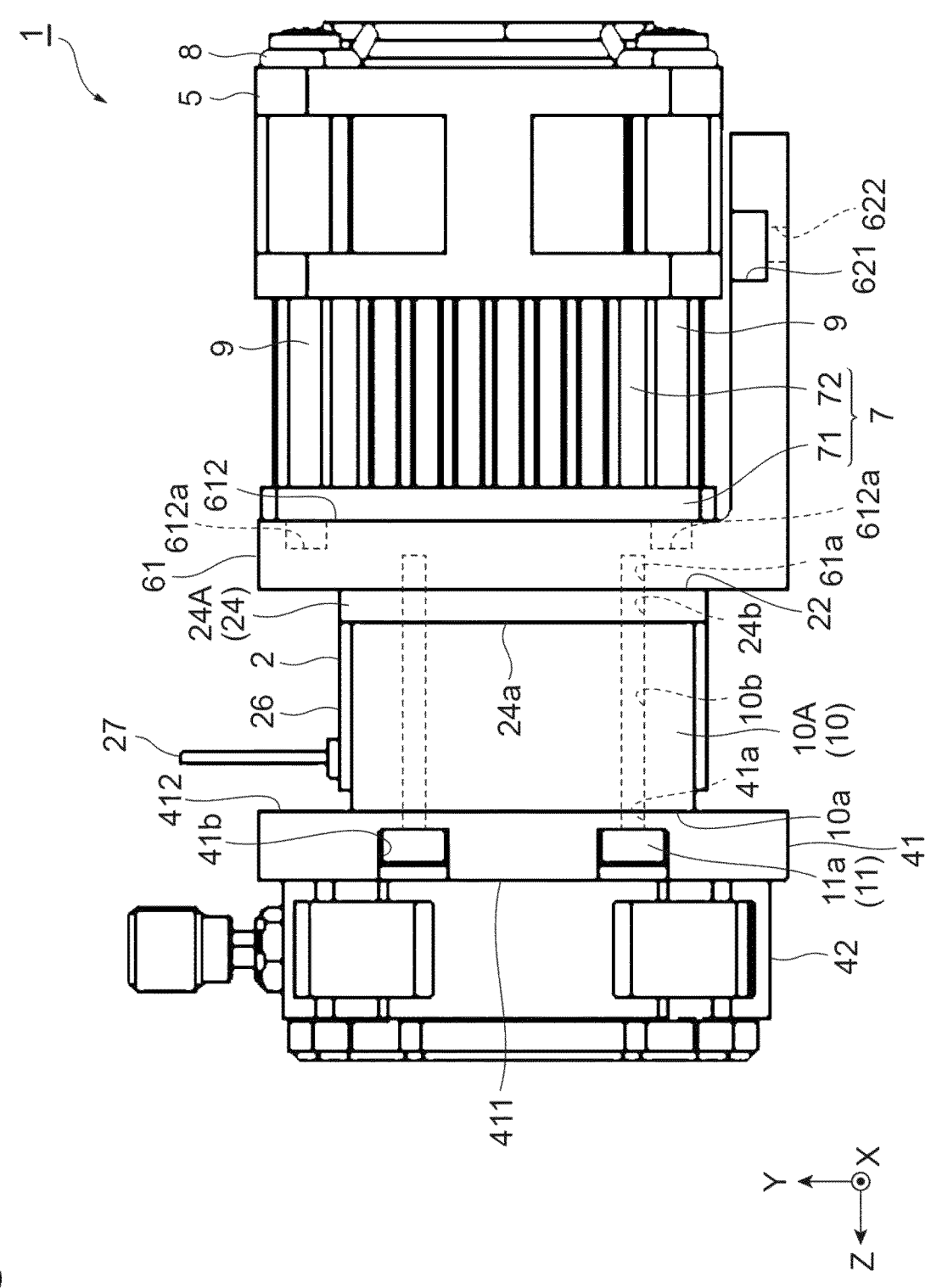
FIG. 4 is a side view of the quantum cascade laser module of FIG. 1.

Hereinafter, an embodiment of the present invention will be described in detail with reference to the drawings. In the following description, the same or corresponding elements are denoted by the same reference numerals, and redundant description is omitted.

[Configuration of Quantum Cascade Laser Module]

As shown in FIGS. 1 to 4, a quantum cascade laser module 1 (hereinafter referred to as "QCL module 1") includes a package 2 as a light source, a lens hold member 4 that holds a lens 3 on which a laser beam emitted from the package 2 is incident, a cooling fan 5 that cools the package 2, and a base 6 that holds the package 2, the lens hold member 4, and the cooling fan 5. In the following description, an optical axis direction of a laser beam emitted from the package 2 is referred to as a Z-axis direction, and two directions orthogonal to each other and orthogonal to the Z-axis direction are referred to as an X-axis direction and a Y-axis direction.

The package 2 is a quantum cascade laser (QCL) of a high heat load (HHL) package type. The package 2 contains a quantum cascade laser element (hereinafter referred to as "QCL element") that generates light in a mid-infrared range (for example, wavelengths of 5 to 30 μm), for example. As an example, the package 2 is formed in a substantially rectangular parallelepiped shape. The package 2 has a first surface 21 on one side in the Z-axis direction and a second surface 22 on the opposite side of the first surface 21.

The first surface 21 is a surface facing the lens hold member 4. A window material 23 for extracting the laser beam emitted from the QCL element to the outside is provided substantially at the center of the first surface 21. The material of the window material 23 is, for example, zinc selenium (ZnSe), germanium (Ge), or the like. The second surface 22 is a surface facing the base 6 and is in contact with the base 6. The second surface 22 is larger than the first surface 21 by flange 24A and 24B, which will be described later. The package 2 is arranged between the base 6 and the lens hold member 4 so that the window material 23 faces the lens 3.

A pair of flanges 24 (flange 24A, 24B) are provided on an edge portion of the package 2 near the second surface 22. The flange 24A (first flange) and the flange 24B (second flange) are provided at both end portions in the X-axis direction of the package 2. More specifically, the flange 24A and the flange 24B are located opposite to each other in the X-axis direction. That is, the flange 24A and the flange 24B are formed on both sides of the window material 23 in the X-axis direction. The flange 24A and the flange 24B are formed in a rectangular plate shape extending along the Y-axis direction, and protrude in the X-axis direction from a side surface 25 of the package 2 intersecting the X-axis direction. The second surfaces 22 of the flange 24A and the flange 24B are continuous with the second surface 22 of a portion other than the flange 24A and the 24B, are in contact with the base 6 (to be specific, a bottom wall 61 described later), and extend along the base 6.

A plurality of (nine in the present embodiment) lead pins 27 for supplying power from the outside to a component such as a QCL element housed in the package 2 are inserted into one side surface 26 of the package 2 intersecting the Y-axis direction.

The lens hold member 4 is disposed at a position facing the first surface 21 of the package 2. The lens hold member 4 may be constituted by a plurality of components. In the present embodiment, the lens hold member 4 mainly includes a sub-base 41, a lens holder 42, a lens cylinder 43, a lens holding ring 44, and a lens protection ring 45.

The lens holder 42 is a cross-shaped holder movable in each of the X-axis direction and the Y-axis direction. An opening portion 42a penetrating in the Z-axis direction is provided in a central portion of the lens holder 42. The lens cylinder 43 is inserted into the opening portion 42a.

The lens cylinder 43 is a cylindrical member that accommodates the lens 3. A male screw is formed on the outer peripheral surface of the lens cylinder 43. Meanwhile, an inner surface of the opening portion 42a of the lens holder 42 is provided with a female screw that corresponds to the male screw (i.e., that is screwed to the male screw). Thus, the lens cylinder 43 can be inserted into the opening portion 42a of the lens holder 42 while being rotated. In addition, by adjusting the rotation amount of the lens cylinder 43 with respect to the lens holder 42, it is possible to adjust the position (that is, the insertion amount) of the lens cylinder 43 with respect to the lens holder 42 in the Z-axis direction. Accordingly, it is possible to perform position adjustment of the lens 3 in the Z-axis direction (that is, focus adjustment of the laser beam (beam) after being transmitted through the lens 3). Note that an O-ring may be disposed in the fitting portion of the lens cylinder 43 so as to apply resistance (i.e., so as not to loosen) when sliding the lens cylinder 43 with respect to the lens holder 42.

The lens 3, the lens holding ring 44, and the lens protection ring 45 are stored in the lens cylinder 43 in this order. The lens holding ring 44 is a member for fixing the lens 3 to the inner side of the lens cylinder 43 via the lens protection ring 45. The lens protection ring 45 is a member disposed between the lens 3 and the lens holding ring 44 in order to prevent damage to the surface of the lens 3 caused by the lens holding ring 44 coining into contact with the surface of the lens 3. The lens protection ring 45 is formed of, for example, a resin material such as Teflon (registered trademark).

The sub-base 41 is a plate-shaped member disposed between the lens holder 42 and the package 2. The sub-base 41 has a first surface 411 facing the lens holder 42, and a second surface 412 opposite to the first surface 411 and facing the package 2. The material of the sub-base 41 is, for example, aluminum or the like.

The lens holder 42 described above is attached to the first surface 411 of the sub-base 41. More specifically, a through hole 42b through which a support rod 46 for fixing the lens holder 42 to the sub-base 41 is inserted is provided at four corners of the lens holder 42 when viewed from the Z-axis direction. Each through hole 42b extends in the Z-axis direction. A hole portion communicating with the through hole 42b is formed in a part of the wall portion forming each through hole 42b, and a retaining screw 47 for fixing the support rod 46 to the lens holder 42 is inserted into the hole portion. A leading end portion (end portion near the sub-base 41) of the support rod 46 is fixed to the first surface 411 of the sub-base 41. As an example, a screw groove is formed at the leading end portion of each support rod 46. Four screw holes 411a are formed at each position corresponding to each support rod 46 on the first surface 411 of the sub-base 41. The lens holder 42 is fixed to the sub-base 41 via the support rod 46 by screwing the leading end portion of the support rod 46 into the screw hole 411a. As described above, the sub-base 41 and the lens holder 42 are integrally coupled to form the lens hold member 4.

A circular through hole 413 penetrating from the first surface 411 to the second surface 412 is formed in the central portion of the sub-base 41 when viewed from the Z-axis direction. A leading end portion of the lens cylinder 43 is inserted into the through hole 413 and protrudes from the second surface 412 toward the package 2 (see FIG. 3).

The base 6 is an L-shaped plate-shaped member. The base 6 includes a bottom wall 61 facing the second surface 22 of the package 2 and a side wall 62 erected along the Z-axis direction from an end portion on one side in the Y-axis direction of the bottom wall 61. The material of the base 6 is, for example, aluminum or cupper.

The bottom wall 61 is a rectangular plate-shaped portion extending in parallel to the XY plane. The bottom wall 61 has a first surface 611 facing the package 2, and a second surface 612 opposite to the first surface 611 and facing the cooling fan 5. That is, the package 2 and the lens hold member 4 are disposed on the first surface 611 side of the bottom wall 61, and the cooling fan 5 is disposed on the second surface 612 side of the bottom wall 61.

The side wall 62 is a rectangular plate-shaped portion extending in parallel to the XZ plane. The side wall 62 extends to a side opposite to a side on which the package 2 is disposed with respect to the bottom wall 61, and covers the side of the heat sink 7 described later. In the present embodiment, as an example, a through hole 621 (a fixing portion for fixing the QCL module to a fixing object) through which a rod member for fixing the QCL module 1 to a laboratory table or the like is inserted and a counterbore 622 communicating with the through hole 621 are formed in the side wall 62.

The cooling fan 5 is a mechanism for forcibly air-cooling heat generated in the package 2 (mainly heat generated from a QCL element in the package 2). The cooling fan 5 is fixed to the second surface 612 of the bottom wall 61 via the heat sink 7. The heat sink 7 includes a flat plate portion 71 in contact with the second surface 612 and a plurality of radiating fins 72 (in this embodiment, a plurality of rod-shaped members arranged in a lattice pattern) formed on a surface of the flat plate portion 71 opposite to the bottom wall 61. A finger guard 8 for safety (that is, for preventing a human finger or the like from entering the cooling fan 5) is disposed on a side opposite to the heat sink 7 with the cooling fan 5 interposed therebetween. That is, the heat sink 7, the cooling fan 5, and the finger guard 8 are arranged in this order from the side close to the second surface 612 of the bottom wall 61.

The heat sink 7, the cooling fan 5, and the finger guard 8 are fastened together to the bottom wall 61 by a plurality of (four in the present embodiment) screws 9. More specifically, through holes 71a, 5a, and 8a through which the screw 9 is inserted are provided at four corners of each of the heat sink 7 (flat plate portion 71), the cooling fan 5, and the finger guard 8 viewed from the Z-axis direction. Screw holes 612a (see FIGS. 3 and 4) are formed on the second surface 612 of the bottom wall 61. Each screw 9 is inserted into the through hole 71a of the heat sink 7, the through hole 5a of the cooling fan 5, and the through hole 8a of the finger guard 8, and is screwed into the screw hole 612a of the bottom wall 61, so that the heat sink 7, the cooling fan 5, and the finger guard 8 are integrally fixed to the bottom wall 61. In order to efficiently dissipate the heat transferred from the package 2 to the bottom wall 61, heat dissipation grease may be applied between the second surface 22 of the package 2 and the first surface 611 of the bottom wall 61. Similarly, heat dissipation grease may be applied between the second surface 612 of the bottom wall 61 and the flat plate portion 71 of the heat sink 7.

The package 2 and the sub-base 41 (lens hold member 4) are fastened together to the base 6. In the present embodiment, the spacer 10 is disposed between the sub-base 41 and the base 6. The spacer 10 is disposed between the second surface 412 (surface facing the base 6) of the sub-base 41 and the top surface 24a (surface facing the sub-base 41) of the flange 24. More specifically, the spacer 10 includes a spacer 10A (first spacer) corresponding to the flange 24A, and a spacer 10B (second spacer) corresponding to the flange 24B. In other words, the spacer 10A is disposed between the second surface 412 of the sub-base 41 and the top surface 24a of the flange 24A, and the spacer 10B is disposed between the second surface 412 of the sub-base 41 and the top surface 24a of the flange 24B. That is, the spacer 10A and the spacer 10B are disposed on both sides of the window material 23 in the X-axis direction. Each of the spacer 10A and the spacer 10B is formed in a rectangular plate shape. More specifically, each of the spacer 10A and the spacer 10B is an elongated member (that is, a member having a constant width along the Y-axis direction) extending in the Y-axis direction (that is, a direction intersecting Z-axis direction and X-axis direction in which the spacer 10A and the spacer 10B face each other across the window material 23). Since the spacer 10A and the spacer 10B are formed in an elongated shape as described above, the lens hold member 4 and the package 2 can be more stably co-fastened to the base 6 via the spacer 10A and the spacer 10B. The spacer 10 is formed of a material having a heat conductivity lower than that of the base 6. The material of the spacer 10 is, for example, stainless steel or nickel. Thus, heat generated in the package 2 can be efficiently released not to the spacer 10 but to the bottom wall 61.

The height of the spacer 10 in the Z-axis direction is greater than the difference between the height of the package 2 in the Z-axis direction and the height of the flange 24 in the Z-axis direction. That is, in a state where the spacer 10 is in contact with the top surface 24a of the space 24, the end portion 10a of the spacer 10 facing the sub-base 41 protrudes farther to the sub-base 41 than the first surface 21 of the package 2. Since the height of the spacer 10 is set in this manner, a gap S (see FIG. 3) is formed between the sub-base 41 and the first surface 21 and the window material 23 of the package 2. Accordingly, it is possible to prevent distortion (deformation) from occurring in the window material 23 due to contact between the lens hold member 4 and the window material 23 (that is, the lens hold member 4 being pressed against the window material 23), and as a result, it is possible to suppress deterioration of a laser beam (laser beam emitted from the window material 23) caused by the distortion. In addition, even when the leading end portion of the lens cylinder 43 slightly protrudes toward the package 2 through the through hole 413 (see FIG. 2) as in the present embodiment, the leading end portion of the lens cylinder 43 may be prevented from contacting the window material 23 by adjusting the height of the spacer 10 and the size of the gap S.

The sub-base 41, the spacer 10, and the flange 24 are fastened together to the bottom wall 61 by a plurality of (four in the present embodiment) screw members 11 (shaft members). The screw member 11 is, for example, a hexagonal bolt. More specifically, through holes 41a, 10b, 24b, and 61a through which the screw member 11 is inserted are formed at four corners of each of the sub-base 41, the spacer 10, the flange 24, and the bottom wall 61 when viewed from the Z-axis direction. Two through holes 10b are provided at both side edge portions in the Y-axis direction of each of the spacer 10A and the spacer 10B. Two through holes 24b are provided at both side edge portions in the Y-axis direction of each of the flange 24A and the flange 24B. The through hole 61a of the bottom wall 61 is opened to the first surface 611, and is a screw hole in which a screw groove is formed. In addition, a counterbore groove 41b for accommodating the head portion 11a of the screw member 11 is provided on the first surface 411 of the sub-base 41 to communicate with the through hole 41a. Each screw member 11 is inserted into the through hole 41a of the sub-base 41, the through hole 10b of the spacer 10, and the through hole 24b of the flange 24 from the first surface 411 side of the sub-base 41, and is screwed into the through hole 61a of the bottom wall 61. Accordingly, the lens hold member 4 (sub-base 41) is fastened to the base 6 (bottom space 61) via the spacer 10 and the flange 24.

[Effect]

The above-described QCL module 1 includes the cooling fan 5 for cooling the package 2. According to such a configuration, it is possible to achieve miniaturization and simplification of the module compared to a case where a cooling mechanism of another type (for example, a water cooling type) is provided. Further, in the QCL module 1, the package 2 as a light source and the lens hold member 4 (sub-base 41) are fastened together to the base 6 (bottom wall 61) by a common screw member 11 (in the present embodiment, four screw members 11). That is, the package 2 and the lens hold member 4 are integrally fixed by the common screw member 11. Thus, the vibration pattern caused by the vibration of the cooling fan 5 is common between the package 2 and the lens 3 held by the lens hold member 4. As a result, the variation of the relative positional relationship between the package 2 and the lens 3 is suppressed, and the temporal variation of the optical condition (for example, the Fabry-Perot cavity length) between the package 2 and the lens 3 is suppressed. As a result, it is possible to reduce optical noise caused by temporal fluctuation of the optical conditions.

The above-described effect will be specifically described by exemplifying a case where gas concentration measurement using the QCL module 1 is performed. In such gas concentration measurement, for example, the QCL module 1 and a photodetector are prepared, and a gas cell in which a gas to be measured is sealed is disposed between the QCL module 1 and the photodetector. Then, the laser beam emitted from the QCL module 1 (that is, the laser beam emitted from the window material 23 of the package 2 and passing through the lens 3) passes through the gas cell, and the laser beam after passing through the gas cell is detected by the photodetector. Accordingly, it is possible to measure the concentration of the gas (the absorbance of the laser beam) in the gas cell. Since the QCL has excellent monochromaticity (that is, excellent wavelength resolution), the QCL is suitably used for the above-described gas concentration measurement or the like. However, since the QCL has excellent monochromaticity, fringe noise due to an etalon effect occurs in principle. This fringe noise is caused by the fact that optical elements such as the lens 3 and the window material 23 arranged between the QCL element and the photodetector in the package 2 have finite reflectivity, that is, an optically reflective interface exists in the optical path of the laser beam. A Fabry-Perot resonator is formed by the reflection interface and the radiation end surface of the QCL element, and the fringe noise is generated by interference of light. Since the fringe noise (i.e., the Fabry-Perot interference condition) is constant if the Fabry-Perot resonator length does not change, the fringe noise can be treated as an invariant. That is, the fringe noise may be removed by a background operation (difference operation). On the other hand, when the Fabry-Perot resonator length varies with time, the Fabry-Perot interference condition also varies with time, so that the fringe noise cannot be treated as an invariant. As a result, the fringe noise cannot be removed by the above-described background calculation. In addition, in gas concentration measurement using the QCL module 1, tunable diode laser absorption spectroscopy (TDLAS) that temporally changes an oscillation wavelength of a laser is widely used. When such a measurement method is used, a fluctuation component of the Fabry-Perot interference condition caused by a change in the oscillation wavelength of the laser is also superimposed on the fringe noise, and thus extremely complicated optical noise is generated. Such optical noise is a factor that limits the detection limit of gas concentration measurement as described above.

Here, a comparative example having a configuration in which the lens hold member is not fastened to the base together with the package and is fixed to the base separately from the package will be considered. For example, a plate-shaped portion extending toward the lens hold member may be provided on the bottom wall of the base, and the lens hold member may be fixed to the plate-shaped portion independently of the package. In the comparative example having such a configuration, the way in which vibration is transmitted from the cooling fan differs between the package and the lens hold member. More specifically, in the above comparative example, the package is fixed to the bottom wall of the base to which the cooling fan is fixed, whereas the lens hold member is fixed to the plate-shaped portion different from the bottom wall. For this reason, the vibration frequency of the lens held by the lens hold member is affected by the mechanical vibration resonance of the plate-shaped portion, and thus does not have the same phase as the vibration of the QCL (that is, package). As a result, the distance (optical path length) between the QCL and the lens temporally varies, and the Fabry-Perot resonance condition (that is, the Fabry-Perot resonator length) between the QCL and the lens temporally varies. As a result, since the fringe noise cannot be treated as an invariant as described above, the fringe noise is detected as a complicated optical noise structure in the photodetector.

In addition, in a case where the vibration of the QCL and the vibration of the lens do not have the same phase and the positional relationship (optical path length) between the QCL and the lens temporally varies, the deflection amount of the laser beam transmitted through the lens in the XY plane (plane orthogonal to the Z-axis direction which is the optical axis direction) is amplified. Therefore, in the photo-detector (light receiving unit), the spot position irradiated with the laser beam varies with time. Therefore, in the comparative example, a fluctuation component of the output value of the photodetector caused by the fluctuation of the spot position may also be generated as optical noise.

On the other hand, in the QCL module 1 described in the above embodiment, the lens hold member 4 is firmly fixed (co-fastened) to the base 6 (bottom wall 61) integrally with the package 2. For this reason, since the vibration of the QCL (package 2) and the vibration of the lens 3 held by the lens hold member 4 have the same phase, the above-described Fabry-Perot resonance condition does not temporally change. As a result, the fringe noise can be treated as an invariant and removed by background calculation or the like, so that the optical noise can be reduced. In addition, since the positional relationship (optical path length) between the QCL (package 2) and the lens 3 does not temporally change (becomes constant), the deflection amount of the laser beam in the XY plane after passing through the lens 3 is not amplified. As a result, it is also possible to suppress the occurrence of optical noise caused by a change in the spot position of the photodetector that may occur in the comparative example.

In addition, the package 2 is disposed between the base 6 (bottom wall 61) and the lens hold member 4 (sub-base41) so that the window material 23 faces the lens 3. The package 2 and the lens hold member 4 are fastened together to the base 6 by fastening the lens hold member 4 to the base 6. Thus, the lens hold member 4 and the package 2 can be integrally fixed to the base 6 such that the package 2 is sandwiched between the lens hold member 4 and the base 6.

The QCL module 1 also includes the spacer 10 disposed between the lens hold member 4 and the base 6. The package 2 has the flange 24 which abuts against the base 6 and extends along the base 6. The spacer 10 is disposed between the surface of the lens hold member 4 facing the base 6 (in the present embodiment, the second surface 412 of the sub-base 41) and the top surface 24a of the flange 24 facing the lens hold member 4, so that the gap S is formed between the lens hold member 4 and the window material 23. Accordingly, it is possible to prevent distortion (deformation) from occurring in the window material 23 due to contact between the lens hold member 4 and the window material 23. As a result, deterioration of the laser beam caused by the distortion can be suppressed.

Also, the flange 24 has the flange 24A and the flange 24B formed on both sides of the window material 23. The spacer 10 includes the spacer 10A disposed between the second surface 412 of the sub-base 41 and the top surface 24a of the flange 24A, and the spacer 10B disposed between the second surface 412 of the sub-base 41 and the top surface 24a of the flange 24B. In this way, by arranging the pair of spacers 10A and 10B between the package 2 and the lens hold member 4 in a well-balanced manner, the physical stabilities of the package 2 and the lens hold member 4 can be enhanced, and a variation in the relative positional relationship between the package 2 and the lens hold member 4 (that is, the positional relationship between the QCL and the lens 3) can be effectively suppressed. In the present embodiment, a plurality of (two in the present embodiment) screw members 11 are inserted into one spacer 10 (spacer 10A or spacer 10B). As described above, since the plurality of screw members 11 are inserted into the common spacer 10, the lens hold member 4 and the package 2 can be more stably fastened together with respect to the base 6 via the spacer 10.

Each of the lens hold member 4 (the sub-base 41 in the present embodiment), the spacer 10, the base 24, and the base 6 (the bottom wall 61 in the present embodiment) has through holes 41a, 10b, 24b, and 61a through which the screw member 11 is inserted. The lens hold member 4 is fastened to the base 6 by the screw member 11 inserted through the through holes 41a, 10b, 24b, and 61a of each of the lens hold member 4, the spacer 10, the flange 24, and the base 6, so that the lens hold member4, the spacer 10, and the flange 24 are fastened together to the base 6. In this case, the lens hold member 4, the spacer 10, and the flange 24 can be integrally and firmly fixed to the base 6 by inserting the common screw member 11 into the through hole 61a of the base 6 through the lens hold member 4, the spacer 10, and the flange 24. Accordingly, it is possible to effectively suppress a change in the relative positional relationship between the package 2 and the lens hold member 4.

[Modification]

Although one embodiment of the present disclosure has been described above, the present disclosure is not limited to the above embodiment. The material and shape of each component are not limited to those described above, and various materials and shapes may be employed. For example, in the above-described embodiment, as a form of co-fastening, a form in which the screw member 11 is screw-fastened to the through hole 61*a* (screw hole) provided in the bottom wall 61 of the base 6 is illustrated, but the screw member 11 may be engaged with a nut. For example, the package 2 and the lens hold member 4 may be co-fastened (fastened together) to the base 6 by providing a through hole penetrating from the first surface 611 to the second surface 612 in the bottom wall 61, inserting the screw member 11 (bolt) into the through hole, and fitting a nut disposed on the second surface 612 side to a leading end portion of the screw member 11. The same applies to the screw 9 that fixes the cooling fan 5 to the bottom wall 61.

In the above-described embodiment, the lens hold member 4 is formed by combining the sub-base 41 and the lens holder 42, but the sub-base 41 may be omitted. For example, the lens holder 42 itself may be provided with a through hole through which the screw member 11 is inserted, and the lens holder 42, the spacer 10, and the flange 24 may be co-fastened to the base 6.

Further, the base 6 may not have the side wall 62. In this case, a fixing portion (for example, a through hole through which the above-described rod member is inserted) for fixing the QCL module to the fixing target may be provided in the bottom wall 61. Further, in this case, in order to secure a region for providing the fixing portion, the base 6 may include a bottom wall larger than the bottom wall 61 shown in the above-described embodiment (for example, a bottom wall wider than the above-described bottom wall 61).

Figure 5:
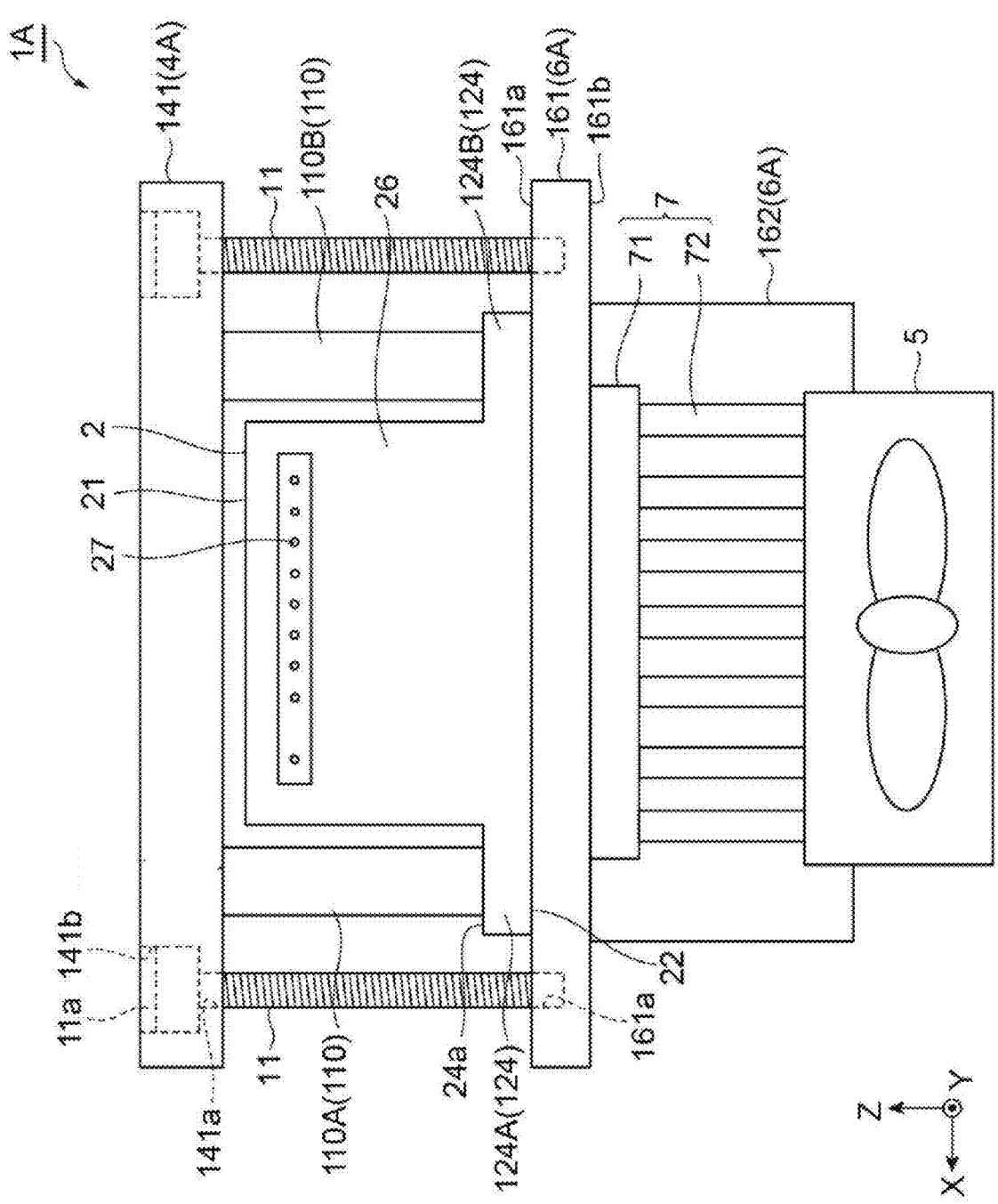
FIG. 5 is a diagram showing a part of a quantum cascade laser module according to a modification example.

In addition, like the QCL module 1A according to the modification example illustrated in FIG. 5, the common screw member 11 may not penetrate the spacer and the flange. The QCL module 1A is different from the QCL module 1 in that the package 2A is provided instead of the package 2, the lens hold member 4A is provided instead of the lens hold member 4, the base 6A is provided instead of the base 6, and the spacer 110 is provided instead of the spacer 10. In FIG. 5, the cooling fan 5 and the heat sink 7 are schematically shown, and elements (that is, the lens holder 42, the lens cylinder 43, and the like) other than the sub-base 141 (element corresponding to the sub-base 41) of the lens hold member 4A are not illustrated.

The package 2A differs from the package 2 in that it has a flange 124 (flange 124A, 124B) instead of the flange 24 (flange 24A, 24B). The flange 124 differs from the flange 24 in that it does not have a through hole 24*b*.

The lens hold member 4A differs from the lens hold member 4 in that it has a sub-base 141 instead of the sub-base 41. Like the sub-base 41, the sub-base 141 has a through hole 141*a* and a counterbore groove 141*b* through which the screw member 11 is inserted. On the other hand, the sub-base 141 is slightly wider than the sub-base 41 in the X-axis direction, which is different from the sub-base 41. Further, the positions of the through hole 141*a* and the counterbore groove 141*b* in the X-axis direction are outside the positions of the through hole 41*a* and the counterbore groove 41*b* of the sub-base 41 in the X-axis direction.

The base 6A differs from the base 6 in that it has a bottom wall 161 instead of the bottom wall 61. Like the bottom wall 61, the bottom wall 161 has a first surface 161*a*, a second surface 161*b*, and a through hole 161*c*. On the other hand, the bottom wall 161 is different from the bottom wall 61 in that the width in the X-axis direction of the bottom wall 161 is slightly larger than that of the bottom wall 61. Further, the position of the through hole 161*c* in the X-axis direction is outside the position of the through hole 61*a* of the bottom wall 61 in the X-axis direction. More specifically, the through hole 161*c* is located outside the spacer 110 and the flange 124 in the X-axis direction.

The spacer 110 (spacer 110A, 110B) differs from the spacer 10 (spacer 10A, 10B) in that it does not have a through hole 10*b*.

In the QCL module 1A, the sub-base 141 (lens hold member 4A) and the bottom wall 161 (base 6A) are respectively formed with a through holes 141*a* and 161*c* through which the screw member 11 is inserted. In a state where the spacer 110 and the flange 124 are disposed between the sub-base 141 and the bottom wall 161, the sub-base 141 is fastened to the bottom wall 161 by the screw member 11 inserted into the through holes 141*a* and 161*c* of each of the sub-base 141 and the bottom wall 161, so that the lens hold member 4A, the spacer 110, and the flange 124 are co-fastened to the base 6A. In this case, the screw member 11 is passed through the lens hold member 4A and inserted into the through hole 161*c* of the base 6A, and the lens hold member 4A and the base 6A sandwich the spacer 110 and the flange 124 disposed therebetween (in other words, the spacer 110 and the flange 124 are pressed from both sides in the Z-axis direction like a vise), thereby integrally and firmly fixing the lens hold member 4A, the spacer 110, and the flange 124 to the base 6A. Accordingly, it is possible to effectively suppress a change in the relative positional relationship between the package 2A and the lens hold member 4A. Further, according to the QCL module 1A, it is not necessary to provide through holes in the spacer 110 and the flange 124. On the other hand, in the QCL module 1A, since the position of the screw member 11 in the X-axis direction is located outside than that of the QCL module 1, the QCL module 1 is more advantageous than the QCL module 1A from the viewpoint of reducing the widthwise dimension of the module in the X-axis direction.

REFERENCE SIGNS LIST

1, 1A: quantum cascade laser module, 2, 2A: package, 3: lens, 4, 4A: lens hold member, 5: cooling fan, 6, 6A: base, 10, 110A: spacer, 10A, 110A: spacer (first spacer), 11: screw member (shaft member), 23: window material, 24, 124: flange, 24A, 124A: flange (first flange), 24B, 124B: flange (second flange), S: gap.

The invention claimed is:

1. A quantum cascade laser module comprising:
   a package that accommodates a quantum cascade laser element and is provided with a window material through which a laser beam emitted from the quantum cascade laser element is extracted to the outside;
   a lens hold member configured to hold a lens on which the laser beam output from the window material is incident;
   a cooling fan configured to cool the package;
   a base that holds the package, the lens hold member, and the cooling fan; and
   a spacer disposed between the lens hold member and the base, wherein the package and the lens hold member are fastened together to the base by a common shaft member, the package is disposed between the base and the lens hold member such that the window material faces the lens, the package and the lens hold member are fastened together to the base by fastening the lens hold member to the base, the package has a flange that abuts against the base and extends along the base, and the spacer is disposed between a surface of the lens hold member facing the base and a surface of the flange facing the lens hold member, so that a gap is formed between the lens hold member and the window material.

2. The quantum cascade laser module according to claim 1, wherein the flange includes a first flange and a second flange formed on both sides of the window material, and the spacer includes:

a first spacer disposed between the surface of the lens hold member facing the base and a surface of the first flange facing the lens hold member; and a second spacer disposed between the surface of the lens hold member facing the base and a surface of the second flange facing the lens hold member.

3. The quantum cascade laser module according to claim 1, wherein a through hole through which the shaft member is inserted is formed in each of the lens hold member, the spacer, the flange, and the base, and the lens hold member is fastened to the base by the shaft member inserted through the through hole of each of the lens hold member, the spacer, the flange, and the base, so that the lens hold member, the spacer, and the flange are fastened together to the base.

4. The quantum cascade laser module according to claim 1, wherein a through hole through which the shaft member is inserted is formed in each of the lens hold member and the base, and in a state where the spacer and the flange are disposed between the lens hold member and the base, the lens hold member is fastened to the base by the shaft member inserted into the through hole of each of the lens hold member and the base, so that the lens hold member, the spacer, and the flange are fastened together to the base.

5. The quantum cascade laser module according to claim 1, wherein the spacer is formed of a material having heat conductivity lower than that of the base.

6. A quantum cascade laser module comprising:

a package that accommodates a quantum cascade laser element and is provided with a window material through which a laser beam emitted from the quantum cascade laser element is extracted to the outside;

a lens hold member configured to hold a lens on which the laser beam output from the window material is incident;

a cooling fan configured to cool the package;

a base that holds the package, the lens hold member, and the cooling fan; and a spacer disposed between the lens hold member and the base, wherein the package and the lens hold member are fastened together to the base by a common shaft member, the package is disposed between the base and the lens hold member such that the window material faces the lens, the package and the lens hold member are fastened together to the base by fastening the lens hold member to the base, the package has a portion that faces the base and extends along the base, and the spacer is disposed between a surface of the lens hold member facing the base and a surface of the portion facing the lens hold member, so that a gap is formed between the lens hold member and the window material.

* * * * *